United States Patent [19]

Cooperman et al.

[11] Patent Number: 5,494,857
[45] Date of Patent: Feb. 27, 1996

[54] CHEMICAL MECHANICAL PLANARIZATION OF SHALLOW TRENCHES IN SEMICONDUCTOR SUBSTRATES

[75] Inventors: Steven S. Cooperman, Southborough; Andre I. Nasr, Marlborough, both of Mass.

[73] Assignee: Digital Equipment Corporation, Maynard, Mass.

[21] Appl. No.: 98,533

[22] Filed: Jul. 28, 1993

[51] Int. Cl.⁶ .......................... H01L 21/304; H01L 21/76
[52] U.S. Cl. .............................. 437/228; 437/67
[58] Field of Search ........................... 437/67, 225, 228; 156/636.1, 644, 1; 148/DIG. 50, 85, 86

[56] References Cited

U.S. PATENT DOCUMENTS

| | | | |
|---|---|---|---|
| 4,526,631 | 7/1985 | Silvestri et al. | 148/175 |
| 4,666,556 | 5/1987 | Fulton et al. | 156/643 |
| 4,671,851 | 6/1987 | Beyer et al. | 156/645 |
| 4,689,656 | 8/1987 | Silvestri et al. | 357/49 |
| 4,745,081 | 5/1988 | Beyer et al. | 437/38 |
| 5,006,482 | 4/1991 | Kerbaugh et al. | 437/67 |
| 5,077,234 | 12/1991 | Scoopo et al. | 437/67 |
| 5,173,439 | 12/1992 | Dash et al. | 437/67 |
| 5,175,122 | 12/1992 | Wang et al. | 437/67 |
| 5,177,028 | 1/1993 | Manning | 437/41 |
| 5,229,318 | 6/1993 | Straboni et al. | 437/67 |
| 5,346,584 | 9/1994 | Nasr et al. | 437/67 |

FOREIGN PATENT DOCUMENTS

| | | | |
|---|---|---|---|
| 0340524 | 11/1989 | European Pat. Off. | |
| 0597603 | 5/1994 | European Pat. Off. | |
| 63-142831 | 6/1988 | Japan | 437/67 |
| 2-16752 | 1/1990 | Japan | 437/67 |

OTHER PUBLICATIONS

"Maskless Method for Shallow Trench Planarization", IBM Technical Disclosure Bulletin, vol. 33, No. 4, pp. 433–434, Sep. 1990.

"Fully Recessed Oxide Isolation Planarization Without the Dip Normally Found in Wide Areas", IBM Technical Disclosure Bulletin, vol. 29, pp. 4136–4137, Feb. 1987.

"Method for Planarizing Over Shallow Trenches Filled With Silicon Dioxide", IBM Technical Disclosure Bulletin, vol. 32, pp. 439–440, Feb. 1990.

T. H. Daubenspeck, J. K. DeBrosse, C. W. Koburger, M. Armocost, and J. R. Abernathey, "Planarization of ULSI Topography Over Variable Pattern Densities", J. Electrochem. Soc., vol. 138, No. 2, pp. 506–509, Feb. 1991.

B. Davari, C. W. Koburger, R. Schulz, J. D. Warnock, T. Furukawa, M. Jost Y. Taur, W. G. Schwittek, J. K. DeBrosse, M. L. Kerbaugh, and J. L. Mauer, "A New Planarization Technique, Using A Combination Of RIE And Chemical Mechanical Polish (CMP)", IEDM Technical Digest, pp. 3.4.1–3.4.4, 1989.

D. J. Sheldon, C. W. Gruenshclaeger, L. Kammerdiner, N. B. Henis, P. Kelleher, and J. D. Hayden, "Application Of A Two-Layer Planarization Process To VLSI Intermetal Dielectric And Trench Isolation Processes", IEEE Transactions Semiconductor Manufacturing, 1, No. 4, pp. 140–145, Nov. 1988.

*Primary Examiner*—George Fourson
*Assistant Examiner*—S. Mulpuri
*Attorney, Agent, or Firm*—Arthur W. Fisher; Denis G. Maloney; Mark J. Casey

[57] ABSTRACT

A new method for planarization of shallow trenches is presented. Shallow trenches are patterned into a semiconductor substrate that has been coated with a layer of silicon nitride. A conformal coating of oxide is deposited onto the wafer to fill the trenches. A thin layer of etch-stop silicon and a second layer of oxide are then deposited. The second layer of oxide is patterned with a filler mask using conventional photolithographic techniques and etched to the silicon etch-stop layer, leaving blocks of oxide in the depressions above the trenches and oxide spacers along the sidewalls. Chemical mechanical polishing is then used to polish the oxide back to the silicon nitride. The process offers excellent global planarity, minimal variation in silicon nitride thickness across active areas of varying size and density, and relative insensitivity to chip design.

17 Claims, 2 Drawing Sheets

CHEMICAL MECHANICAL PLANARIZATION OF SHALLOW TRENCHES IN SEMICONDUCTOR SUBSTRATES

BACKGROUND OF THE INVENTION

This invention relates to a method of fabricating semiconductor devices and more specifically to a planarization process for use during the fabrication of semiconductor devices.

Very Large Scale Integrated (VLSI) and Ultra Large Scale Integration (ULSI) circuits utilize a variety of devices having different feature sizes or device dimensions. Such devices include, but are not limited to, transistors, diodes, capacitors, resistors and wires. The minimum state of the art device dimensions have shrunk to the submicron level. Some devices may have submicron feature sizes while others may simultaneously have much greater feature sizes. Shallow trenches of constant height and varying widths are used to isolate individual devices. These trench widths can vary greatly. These trenches are typically filled with a dielectric material, such as silicon oxide. Because of the complex topography, especially when shallow trenches of greatly varying widths are used, a problem often encountered is achieving a uniform oxide fill, in those trenches, independent of trench size and device density. For such VLSI and ULSI circuits, topology management during fabrication has become a critical process step.

As feature sizes or device dimensions are scaled downward, more stringent requirements on deposition, photo, and etching processing are posed. Surface-clearing planarization processes, such as are used to create oxide-filled trench isolation, often require that the planarized material thickness be controlled to within a very tight tolerance. When simultaneously achieved over all topographies this condition is referred to as "global" planarization.

As compared to conventional Local Oxidation of Silicon (LOCOS) isolation, shallow trench isolation (STI) offers improved isolation between devices and greater packing density. Additionally STI offers a higher degree of planarity, which becomes increasingly important as the photolithographic depth of focus budget continues to shrink with decreasing minimum line width.

A common method for planarizing shallow trenches is a combined resist etch-back (REB)/chemical mechanical polish (CMP). This combined REB/CMP process sequence is as follows. The isolation trenches are patterned onto a semiconductor wafer or substrate, generally a silicon substrate. Oxide is deposited conformally onto the wafer with patterned trenches. Photoresist filler blocks then are patterned into the gaps above the trenches. A second resist layer then is coated onto the wafer to create a relatively planar surface. The filler blocks prevent resist from flowing down into the depressions above the trenches, reducing variations in resist thickness across various active area and trench dimensions. This provides a relatively planar surface for the subsequent etch-back. The wafer then is etched, leaving a small amount of oxide on the active areas. Finally, CMP is used to polish the oxide back to the silicon nitride that caps the active area mesas. However, this REB/CMP process is pattern-dependent. During the REB step, small active areas adjacent to trenches that are too small to receive a resist filler block (due to photolithographic tolerances), but too large to fill during oxide deposition, will have less resist than large active areas. Therefore, these small active areas will have less oxide following the etch. With regard to CMP, the small isolated active areas will polish faster than large dense active areas. These adverse pattern effects are well known. Dishing, an undesirable polishing of oxide in wide trenches due to polishing pad deformation, also will occur during the CMP step. The result of these pattern dependencies is that the silicon nitride thickness will vary significantly across various feature sizes following the REB/CMP process, adversely impacting final planarity.

Another method to obtain better planarization of a silicon wafer is to utilize three resist layers. This is accomplished by depositing a conformal oxide onto the silicon wafer followed by patterning filler resist blocks and coating a second resist layer, similar to the two resist layer process previously described above. The second resist layer is etched back to the conformal oxide, and then a third resist layer is applied. This method produces better planarization than the conventional two resist layer method described above. However, some variation in oxide thickness will still exist. Further, the additional etch and coat steps reduce the process window due to accumulated non-uniformities.

Accordingly, although various improvements in planarization techniques have been developed, manufacturability problems still exist related to final nitride thickness variation between isolated and dense areas as well as non-uniform resist coat and etch-back.

SUMMARY OF THE INVENTION

Now, an improved method for planarizing a semiconductor substrate having shallow trenches has been developed. This invention, which places an oxide block in the depressions above the trenches following an initial oxide deposition, substantially reduces polish rate dependency on feature size and density.

According to the present invented method, a semiconductor substrate, typically coated with a silicon nitride layer, is patterned to form trenches. The regions between the trenches define active regions of variable or consistent size and density. A conformal dielectric layer is deposited onto the substrate, followed by a second conformal polish-assist layer. The second conformal polish-assist layer is patterned using conventional techniques and etched to the dielectric layer, leaving polish-assist blocks in the depressions above the trenches and polish-assist spacers along the sidewalls of the depression. The polish-assist layer and the dielectric layer then are polished back to the top of the active regions to provide highly planarized shallow trenches with excellent global planarity and minimal thickness variation across active areas of various size and density.

BRIEF DESCRIPTION OF THE DRAWINGS

For further understanding of the present invention, reference should be made to the following detailed description of a preferred embodiment taken in conjunction with the accompanying drawings in which like elements have been given like reference numerals, and wherein.

DETAILED DESCRIPTION OF PREFERRED EMBODIMENTS

A planarization method to obtain a planar substrate which is substantially independent of substrate surface geometry or the chip density is described.

Figure 1:
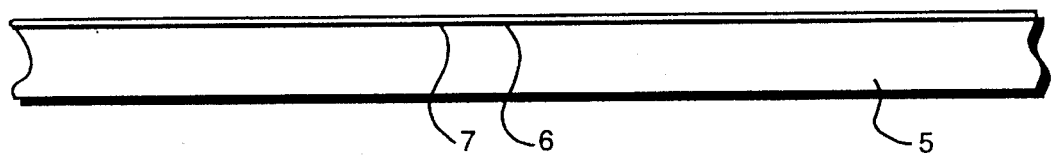
FIG. 1 shows a cross-section of a portion of a substrate layered with material necessary to produce active regions.
Figure 2:
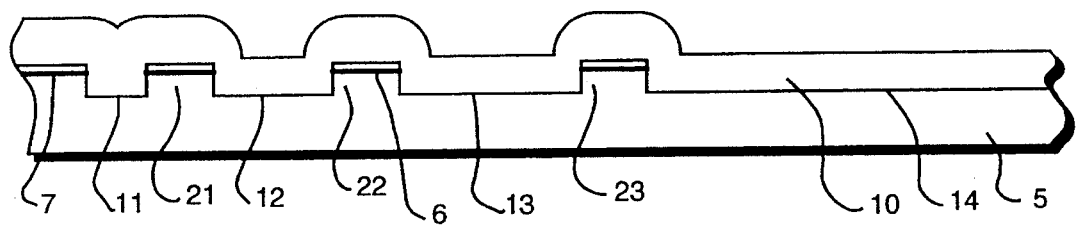
FIG. 2 shows a cross-section of a portion of a substrate containing trenches and active regions of different widths, after a first conformal oxide layer has been formed.

FIG. 1 shows a semiconductor substrate or wafer 5 with a thermally grown oxide layer 6 and a chemical vapor deposition ("CVD") silicon nitride layer 7. FIG. 2 depicts the wafer 5 with shallow trenches 11, 12, 13 and 14 which, typically, are of varying size and density. The shallow trenches are patterned into the wafer using conventional photolithographic and reactive ion etching techniques ("RIE"). The silicon nitride layer 7 and oxide layer 6 are etched, preferably, in a nitrogen trifluoride (NF3) plasma, and the silicon is etched, preferably, in a chlorine/hydrogen bromide ($Cl_2$/HBr) chemistry. A typical trench depth, as depicted in 11, 12, 13 and 14, is approximately 4500 Å.

The surface geometry of the substrate 5 thus contains active areas 21, 22, and 23 of near constant height which are separated by trenches of varying widths (horizontal distances) 11, 12, 13 and 14. Generally, when shallow trenches such as 11, 12, 13, and 14 need to be formed in a wafer, the ultimate objective is to fill the trenches with a dielectric material, so as to obtain a flat or planar substrate having shallow trenches. The dielectric material can be any dielectric or a material convertible to a dielectric. Such materials include silicon, silicon oxide, silicon nitride, silicon implanted with nitrogen, and the like. Generally, silicon oxide is the preferred dielectric material, and will be use used in the description below. Tetraethylorthosilicate (TEOS)-based CVD oxide is particularly preferred as the dielectric material. To obtain a globally planar surface, a series of processing steps are necessary and are described by the method of this invention.

A conformal oxide film 10 is formed, as shown in FIG. 2, generally using CVD methods, which are well known in the art of making semiconductor devices.

Figure 3:
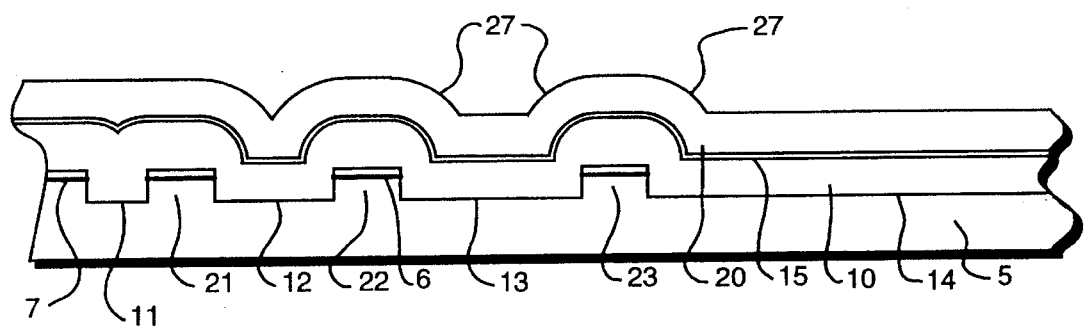
FIG. 3 depicts the structure of FIG. 2 after a etch-stop layer of polysilicon followed by a conformal polish-assist oxide layer has been formed.

The first conformal CVD oxide layer 10 is of thickness such that the oxide in the trenches will be about the same height as the top surface of the active area mesas, preferably such that the top of the first conformal CVD oxide layer is slightly higher than the top surface of the active area mesas. A typical oxide thickness is approximately 5500 Å. As depicted in FIG. 3, a conformal polish-assist layer 20 is deposited on the first layer of conformal CVD oxide 10. The polish-assist layer can be any material of a compatible polish rate with the first conformal dielectric layer, so as not to cause excessive dishing during polishing. Preferably, the polish-assist layer is a dielectric material such as silicon, silicon oxide, silicon nitride, and the like. Most preferably, the polish-assist layer is the same material as the first conformal dielectric layer, described in this example as a CVD oxide. When the polish-assist layer and the dielectric layer have similar etch rates, as in this example, a thin etch-stop layer 15, preferably a deposited silicon, either amorphous or polysilicon, may be desirable. The second layer of conformal oxide 20 is preferably of a thickness such that the top of the oxide layer 20 above the trenches will be approximately level with the top of the first layer of conformal CVD oxide 10 on the active area mesas. A typical preferred thickness is approximately 5300 Å. The silicon etch-stop layer 15, sandwiched between the two conformal CVD oxide films 10 and 20, should be of thickness sufficient to provide adequate etch stop during the oxide etch, typically about 1000 Å.

Figure 4:
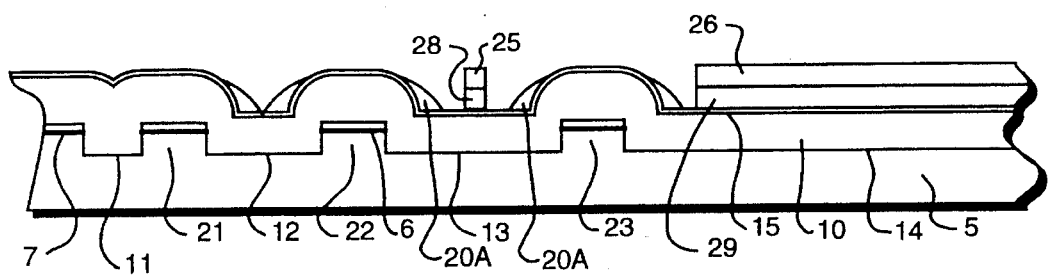
FIG. 4 depicts the structure of FIG. 3 after resist blocks are patterned into depressions above the trenches and the conformal polish-assist oxide layer has been etched to form oxide blocks and spacers.

FIG. 4 illustrates that following the second conformal CVD oxide deposition, resist blocks 25 and 26 are patterned into depressions of sufficient width above trenches 13 and 14 using a filler mask. The filler mask is a reverse tone of the active area mask that is undersized or reduced such that the resist blocks 25 and 26 can sit on the CVD oxide 20 and in the depressions above the trenches 13 and 14 without encroaching onto the sidewalls 27 of the second layer of conformal CVD oxide 20. The oxide is then etched forming oxide blocks 28 and 29. Preferably, the etch is a CHF3/CF4/Ar chemistry with high selectivity, preferably greater than 10 to 1 (oxide to silicon). Preferably, the oxide over-etch can be minimized to leave oxide spacers 20A that will further enhance the degree of oxide "fill". The spacers are particularly useful in trench 12 where the width of the space is too small to receive an oxide block, unlike trenches 13 and 14, and too large to fill during the conformal oxide and silicon depositions, unlike trench 11.

Figure 5:
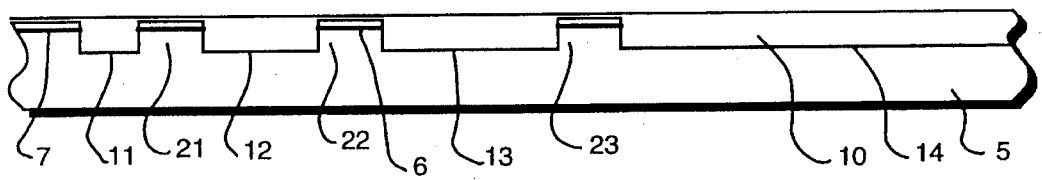
FIG. 5 depicts the structure of FIG. 4 after the polish-assist layer, the etch-stop layer, and the first conformal oxide layer are polished back to the active region layer.

The resist is stripped from the wafer 5, and the wafer is polished back to the silicon nitride 7, as shown in FIG. 5. During the polishing step, the patterned conformal oxide blocks bridge the polishing pad between active area mesas. This bridging eliminates dishing of the oxide 10 located in the trenches and minimizes overpolish requirements by preventing polishing pad deformation across large active area mesas. Additionally, the oxide blocks in combination with the oxide spacers significantly reduce the variation in polish rate between active area mesas of varying size and pattern density. It should be noted that conventional KOH-based silica slurry, used for chemical mechanical polishing of oxide, polishes silicon at approximately 1.5 times faster than thermal oxide. Therefore, the silicon etch-stop remaining on the oxide after the oxide etch is easily polished, and does not impact final planarity.

The method of this invention is described in the context of forming dielectric-filled planar shallow trenches of constant or varying widths in a silicon substrate by way of example only. It will, however, be apparent to one skilled in the art that the present invention disclosed is not limited to the specific embodiment described above and depicted in FIGS. 1–5. This invention is equally applicable to any substrate surface geometry which has regions of a near constant height, separated by same or different lateral distances. It should be also noted that the starting surface geometry of substrate which is to be planarized could be at any one of a number of different stages during the wafer fabrication process. The regions separating the trenches could represent active regions, as described herein, or islands. Also the regions could represent metal lines needing interlevel dielectric so that subsequent metal lines could be patterned. Various other modifications of the disclosed embodiments, as well as other embodiments of the invention, will be apparent to those skilled in the art upon reference to this description, or may be made without departing from the spirit and scope of the invention defined in the appended claims.

What is claimed is:

1. A method of fabricating an integrated circuit device comprising the steps of:

a. forming trenches on a face of a semiconductor substrate, the regions between said trenches at said face defining active region mesas;

forming a first conformal dielectric layer on said face to fill in said trenches;

c. forming a second conformal polish-assist layer on said dielectric layer;

d. patterning resist blocks onto said second conformal polish-assist layer above said trenches;

e. forming polish-assist blocks under said resist blocks and polish-assist spacers along the sidewalls of depressions above the trenches by etching said second conformal polish-assist layer;

f. stripping said resist blocks away from said polish-assist blocks;

polishing back the remaining portion of the second conformal polish-assist layer, and said first conformal dielectric layer, to the top of said active region mesas, forming a globally planar surface.

2. The method according to claim 1 wherein said semiconductor substrate is silicon.

3. The method according to claim 1 wherein said trenches and said active region mesas are of varying dimensions.

4. The method according to claim 1 wherein the conformal dielectric layer is a silicon oxide.

5. The method according to claim 1 wherein said first conformal dielectric layer is a thickness such that the dielectric layer in said trenches will be nearly level with said active region mesas.

6. The method according to claim 4 wherein said conformal dielectric layer is a TEOS oxide layer.

7. The method according to claim 5 wherein said first conformal dielectric layer is a thickness such that the dielectric layer in said trenches will be slightly higher than the top of said active region mesas.

8. The method according to claim 1 including forming an etch-stop layer on said first conformal dielectric layer, prior to forming said polish-assist layer.

9. The method according to claim 8 wherein the etch-stop layer is a deposited silicon layer.

10. The method according to claim 7 wherein said second conformal polish-assist is a thickness such that the top of said patterned blocks will be nearly level with the top of said first conformal dielectric layer over the active region mesas.

11. The method according to claim 1 wherein said resist blocks are patterned into said depressions above said trenches using a filler mask.

12. The method according to claim 11 wherein said resist blocks are patterned such that the resist blocks will sit in spaces of said depressions without encroaching on sidewalls of said depressions.

13. The method according to claim 1 wherein said second conformal polish-assist layer is etched with selectivity utilizing a $CHF_3/CF_4/Ar$ chemistry.

14. The method according to claim 13 wherein said patterned polish-assist blocks are of sufficient width to bridge a polishing pad between active areas during said polishing.

15. The method according to claim 13 wherein said $CHF_3/CF_4/Ar$ chemistry has a selectivity greater than 10:1, oxide:polysilicon.

16. The method of claim 1 wherein said second conformal polish-assist layer is the same type of material as said first conformal dielectric layer.

17. A method of fabricating an integrated circuit device comprising the steps of:

a. forming trenches on a face of a silicon substrate, the regions between said trenches at said face defining active region mesas;

b. forming a first layer of conformal oxide film on said face to fill in said trenches to a level about level with the top of said active region mesas;

c. forming a layer of polysilicon etch-stop on said first layer of conformal oxide film;

d. forming a second layer of conformal polish-assist oxide film on said polysilicon layer at a thickness such that the top of the second oxide film above said trenches is about level with the top of the first conformal oxide film over the active area mesas;

e. patterning resist blocks onto said second layer of conformal oxide into depressions of said second layer of conformal oxide film above said trenches;

f. forming oxide blocks under said resist blocks by etching said second conformal oxide film;

g. stripping said resist blocks away from said oxide blocks;

h. polishing back said second conformal oxide film, said polysilicon layer, and said first conformal oxide film, to the top of said active region mesas forming a globally planar surface.

\* \* \* \* \*